(12) United States Patent
Mizumoto

(10) Patent No.: US 10,353,299 B2
(45) Date of Patent: Jul. 16, 2019

(54) LITHOGRAPHY METHOD, DETERMINATION METHOD, INFORMATION PROCESSING APPARATUS, STORAGE MEDIUM, AND METHOD OF MANUFACTURING ARTICLE

(71) Applicant: CANON KABUSHIKI KAISHA, Tokyo (JP)

(72) Inventor: Kazushi Mizumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/602,591

(22) Filed: May 23, 2017

(65) Prior Publication Data

US 2017/0351182 A1 Dec. 7, 2017

(30) Foreign Application Priority Data

Jun. 1, 2016 (JP) ................................. 2016-109645
May 2, 2017 (JP) ................................. 2017-091948

(51) Int. Cl.
*G03F 7/20* (2006.01)

(52) U.S. Cl.
CPC ........ *G03F 7/70633* (2013.01); *G03F 7/7045* (2013.01)

(58) Field of Classification Search
CPC ............... G03F 7/0002; G03F 7/70358; G03F 7/70433; G03F 7/7045; G03F 7/7055; G03F 7/70633; H01L 21/0274
See application file for complete search history.

(56) References Cited

U.S. PATENT DOCUMENTS

| | | | | |
|---|---|---|---|---|
| 4,734,746 A | * | 3/1988 | Ushida | G03F 7/2022 355/53 |
| 5,976,738 A | * | 11/1999 | Nakashima | G03F 7/2022 430/22 |
| 5,989,761 A | * | 11/1999 | Kawakubo | G03F 7/70358 430/22 |

(Continued)

FOREIGN PATENT DOCUMENTS

| | | |
|---|---|---|
| JP | S62-024624 A | 2/1987 |
| JP | H08-306610 A | 11/1996 |

(Continued)

*Primary Examiner* — Deoram Persaud
(74) *Attorney, Agent, or Firm* — Rossi, Kimms & McDowell LLP

(57) ABSTRACT

The present invention provides a method of forming a first layer including a layout of first shot regions each having a first size and a second layer including a layout of second shot regions each having a second size corresponding to a size including at least two first shot regions to be overlaid on each other, by first processing of forming the first layer in a process including scanning exposure and second processing of forming the second layer, the method including determining, for each of the first shot regions, a scanning direction when performing scanning exposure for the first shot region in the first processing so that combinations each including the scanning directions and the at least two first shot regions included in the second shot region in the first processing are identical in at least some of the second shot regions.

12 Claims, 10 Drawing Sheets

(56) References Cited

U.S. PATENT DOCUMENTS

| | | | | |
|---|---|---|---|---|
| 6,238,851 B1* | 5/2001 | Nishi | ............ | G03F 7/70358 |
| | | | | 355/77 |
| 6,333,776 B1* | 12/2001 | Taniguchi | ............ | G03F 7/70091 |
| | | | | 355/52 |
| 2001/0001056 A1* | 5/2001 | Magome | ............ | G03F 7/70283 |
| | | | | 430/22 |
| 2004/0157143 A1 | 8/2004 | Taniguchi | | |
| 2011/0255066 A1* | 10/2011 | Fuchs | ............ | G03F 7/70633 |
| | | | | 355/67 |
| 2015/0008605 A1* | 1/2015 | Sato | ............ | G03F 7/0002 |
| | | | | 264/40.1 |
| 2017/0043511 A1* | 2/2017 | Sato | ............ | B29C 43/58 |
| 2018/0173118 A1* | 6/2018 | Schmitt-Weaver | ............ | G03F 7/705 |

FOREIGN PATENT DOCUMENTS

| | | | |
|---|---|---|---|
| JP | H09-050950 | A | 2/1997 |
| JP | 2000340493 | A | 12/2000 |
| JP | 2009212471 | A | 9/2009 |
| WO | 99/36949 | A | 7/1999 |

* cited by examiner

F I G. 1
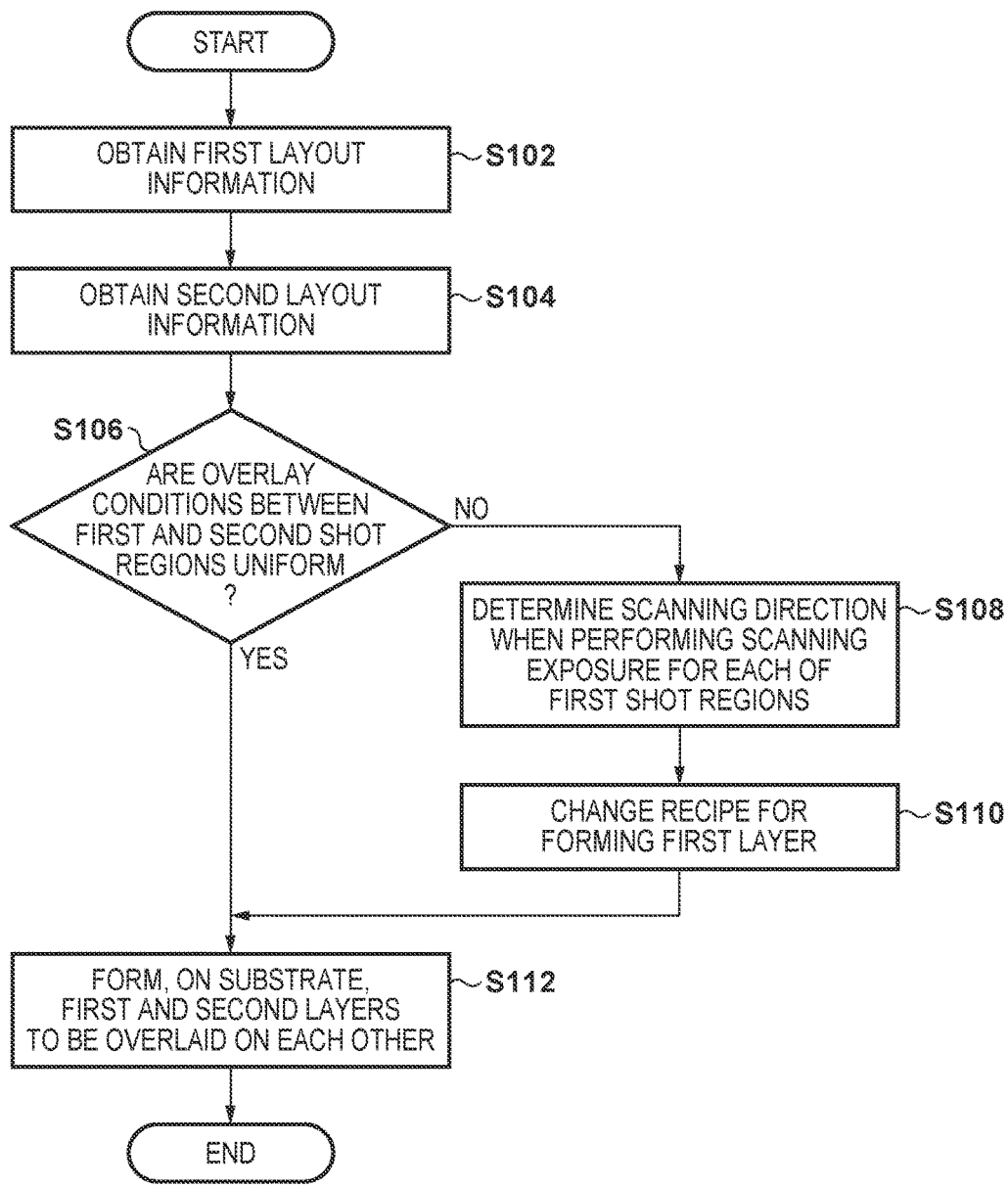

SCANNING DIRECTION

LITHOGRAPHY METHOD, DETERMINATION METHOD, INFORMATION PROCESSING APPARATUS, STORAGE MEDIUM, AND METHOD OF MANUFACTURING ARTICLE

BACKGROUND OF THE INVENTION

Field of the Invention

The present invention relates to a lithography method, a determination method, an information processing apparatus, a storage medium, and a method of manufacturing an article.

Description of the Related Art

International Publication No. 99/36949 and Japanese Patent Laid-Open No. 2009-212471 propose techniques regarding the overlay accuracy (Mix & Match) between different lithography apparatuses. International Publication No. 99/36949 discloses an exposure method of improving the overlay accuracy in accordance with the type of exposure apparatus, that is, a scanner or stepper by considering the characteristics (ease of correction of imaging characteristics) of the apparatus. In this exposure method, when forming, on a substrate, a plurality of layers (patterns) to be overlaid on each other using a plurality of exposure apparatuses, the imaging characteristics of an exposure apparatus for forming an arbitrary layer, among the plurality of exposure apparatuses, are adjusted in consideration of the image distortion correction characteristic of an exposure apparatus for forming another layer.

Japanese Patent Laid-Open No. 2009-212471 discloses a method of reducing a distortion between shot regions by using, for an underlayer pattern, an imprint apparatus for which it is difficult to control the shape of a shot region, and using an exposure apparatus for a pattern to be overlaid on the underlayer pattern.

In recent years, as for semiconductor devices, various techniques for increasing the capacity of a memory and decreasing the size of a memory have been developed by not only two-dimensional miniaturization but also a three-dimensional multilayered structure. Along with the progress of the techniques, the types of lithography apparatuses used to manufacture semiconductor devices have diversified. Furthermore, since the three-dimensional multilayered structure of the semiconductor device increases the number of layers, there is a tendency to require high overlay accuracy with the underlayer pattern in each layer. For example, the overlay accuracy with the stepper or scanner, the overlay accuracy between an exposure apparatus with a normal angle of view (small angle of view) and an exposure apparatus with a large angle of view, the overlay accuracy between an imprint apparatus and an exposure apparatus, and the like are required to be high.

Especially between an exposure apparatus with a normal angle of view and an imprint apparatus with a large angle of view, the tendency of a shot region (exposure region) of a normal angle of view included in a shot region (imprint region) of a large angle of view against which a mold is pressed is generally different for each large angle of view. For example, combinations each including scanning directions and shot regions of normal angle of view included in a shot region of a large angle of view vary with a high probability. Therefore, it is difficult to control matching of shot regions between these apparatuses, thereby causing a definite overlay error.

SUMMARY OF THE INVENTION

The present invention provides a lithography method advantageous in reducing an overlay error when forming, on a substrate, the first and second layers to be overlaid on each other.

According to one aspect of the present invention, there is provided a lithography method of forming, on a substrate, a first layer including a layout of a plurality of first shot regions each having a first size and a second layer including a layout of a plurality of second shot regions each having a second size corresponding to a size including at least two first shot regions to be overlaid on each other, by first processing of forming the first layer in a process including scanning exposure and second processing of forming the second layer, the method including obtaining first layout information representing the layout of the first shot regions, and second layout information representing the layout of the second shot regions, and determining, for each of the first shot regions, based on the first layout information and the second layout information, a scanning direction when performing scanning exposure for the first shot region in the first processing, wherein in the determining, the scanning direction is determined so that combinations each including the scanning directions and the at least two first shot regions included in the second shot region in the first processing are identical in at least some of the second shot regions.

Further features of the present invention will become apparent from the following description of exemplary embodiments with reference to the attached drawings.

BRIEF DESCRIPTION OF THE DRAWINGS

FIG. 1 is a flowchart for explaining a lithography method according to one aspect of the present invention.

DESCRIPTION OF THE EMBODIMENTS

Figure 2A:
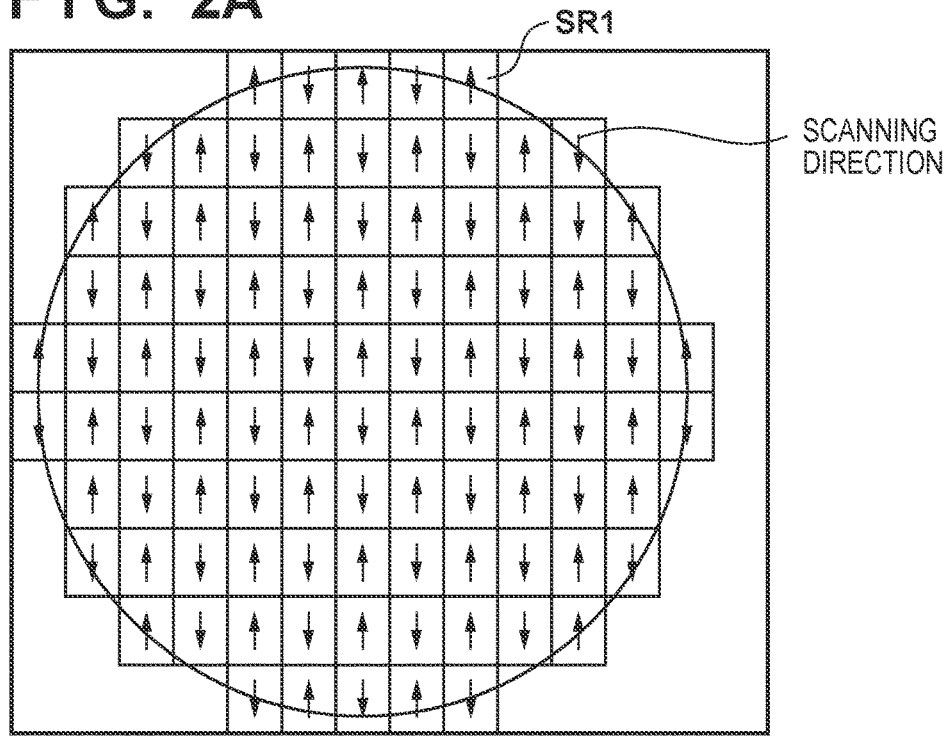
FIGS. 2A and 2B are views respectively showing an example of the layout of the first shot regions and an example of the layout of the second shot regions.

Preferred embodiments of the present invention will be described below with reference to the accompanying drawings. Note that the same reference numerals denote the same members throughout the drawings, and a repetitive description thereof will not be given.

FIG. 1 is a flowchart for explaining a lithography method according to one aspect of the present invention. In this lithography method, the first and second layers are formed, on a substrate, to be overlaid on each other by the first processing of forming the first layer (for example, the Nth layer) in a process including scanning exposure, and the second processing of forming the second layer (for example, the (N+1)th layer or (N−1)th layer). The first layer includes the layout of a plurality of first shot regions each having the first size, and the second layer includes the layout of a plurality of second shot regions each having the second size corresponding to a size including at least two first shot regions. In the first and second processes, different lithography apparatuses (different types of lithography apparatuses) are used. In this embodiment, a scan exposure apparatus (an exposure apparatus called a scanner, or the like) for performing exposure (scanning exposure) for the substrate while scanning a mask (reticle) and the substrate in a scanning direction is used in the first processing, and an imprint apparatus for forming a pattern by bringing a mold into contact with an imprint material on the substrate is used in the second processing. Therefore, the exposure apparatus is used as a lithography apparatus with a small angle of view (the first shot region having the first size) and the imprint apparatus is used as a lithography apparatus with a large angle of view (the second shot region having the second size).

In step S102, the first layout information representing the layout of the first shot regions in the first layer formed by the exposure apparatus is obtained. The exposure apparatus (the storage unit thereof) stores a recipe for forming the first layer. The recipe includes layout information representing the layout of the shot regions in addition to exposure conditions when performing scanning exposure for the substrate (each of the shot regions). Therefore, it is possible to obtain the first layout information with reference to the recipe stored in the exposure apparatus. The exposure conditions include, for example, a scanning direction and scanning speed when performing scanning exposure for each shot region, the exposure order of the respective shot regions, an exposure amount, and the moving path of the substrate between the shot regions.

In step S104, the second layout information representing the layout of the second shot regions in the second layer formed by the imprint apparatus is obtained. The imprint apparatus (the storage unit thereof) stores a recipe for forming the second layer. The recipe includes layout information representing the layout of the shot regions in addition to imprint conditions when performing an imprint process for the substrate. Therefore, it is possible to obtain the second layout information with reference to the recipe stored in the imprint apparatus. The imprint conditions include the residual layer thickness of the imprint material to be formed on the substrate, the filling time of the mold with the imprint material, and the pressing force of the mold. Note that the residual layer thickness indicates the thickness of the imprint material between the surface of the substrate and the surface (bottom surface) of the concave portion of a pattern formed by the cured imprint material.

In step S106, it is determined whether the overlay conditions between the first and second shot regions are uniform, that is, whether combinations each including the scanning directions and at least two first shot regions included in each second shot region in the first processing are identical. In this example, the fact that the combinations each including the scanning directions and at least two first shot regions are identical indicates that combinations are identical in at least some (a predetermined number or more) of the second shot regions. If the overlay conditions between the first and second shot regions are nonuniform, the process advances to step S108. On the other hand, if the overlay conditions between the first and second shot regions are uniform, the process advances to step S112.

In step S108, for each of the first shot regions, the scanning direction when performing scanning exposure for the first shot region in the first processing is determined so that the overlay conditions between the first and second shot regions are uniform. In this example, at least two first shot regions included in the second shot region in the first processing are specified based on the first layout information obtained in step S102 and the second layout information obtained in step S104. Then, the scanning direction of each of the first shot regions is determined so that the combinations each including the scanning directions and at least two first shot regions included in the second shot region are identical in at least some of the second shot regions. At this time, the combinations are preferably identical in all the second shot regions.

In step S110, the recipe for forming the first layer, that is, the recipe stored in the exposure apparatus is changed (updated) based on the scanning directions determined in step S108. For example, the scanning direction when performing scanning exposure for each of the first shot regions included in the recipe stored in the exposure apparatus is changed to the determined scanning direction. Furthermore, the exposure order, in which the first shot regions undergo scanning exposure, included in the recipe stored in the exposure apparatus may be changed so that the scanning direction when performing scanning exposure for each of the first shot regions is changed to the determined scanning direction. In addition, the moving path of the substrate between the first shot regions included in the recipe stored in the exposure apparatus may be changed so that the scanning direction when performing scanning exposure for each of the first shot regions is changed to the determined scanning direction.

In step S112, the first and second processes are executed to form, on the substrate, the first and second layers to be overlaid on each other. As described above, in the first processing, the first layer is formed by performing scanning exposure for the substrate in accordance with the recipe stored in the exposure apparatus, and in the second processing, the second layer is formed by performing the imprint process in accordance with the recipe stored in the imprint apparatus.

In this embodiment, the first processing is performed so that the combinations each including the scanning directions and at least two first shot regions included in each second shot region are identical in at least some of the second shot regions. This facilitates control of matching between at least two first shot regions and the second shot region when performing the imprint process for the second shot region in the second processing (this makes it possible to control matching more accurately). Therefore, this embodiment is advantageous in reducing an overlay error (that is, an overlay error between the different lithography apparatuses) when forming, on the substrate, the first and second layers to be overlaid on each other.

Practical examples of the lithography method according to this embodiment will be described below.

EXAMPLE 1

Figure 2B:
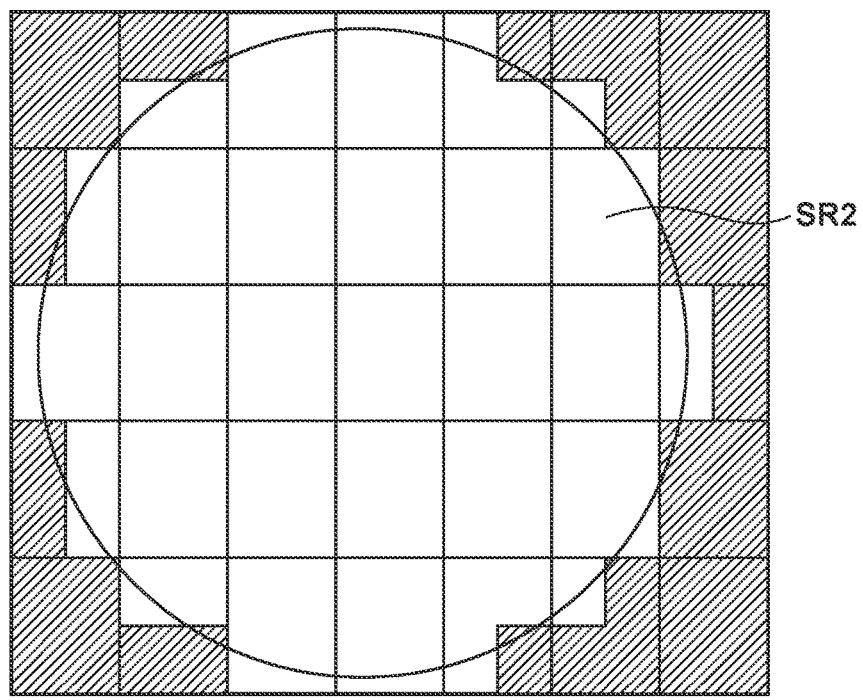

FIG. 2A is a view showing an example of the layout of a plurality of first shot regions SR1 in the first layer. In FIG. 2A, a scanning direction when performing scanning exposure for each of the first shot regions SR1 is indicated by an arrow. FIG. 2B is a view showing an example of the layout of a plurality of second shot regions SR2 in the second layer. Referring to FIGS. 2A and 2B, the size of the first shot region SR1 is different from that of the second shot region SR2, and the second shot region SR2 has a size corresponding to a size including the four first shot regions SR1.

Figure 3A:
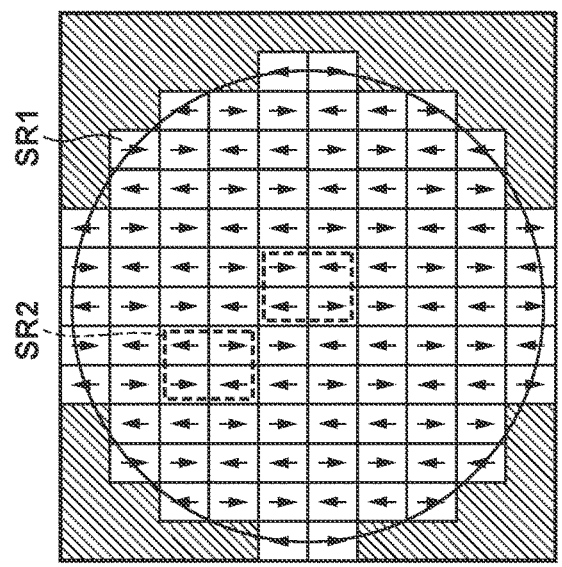
FIGS. 3A to 3C are views for explaining a case in which the first and second layers are overlaid on each other according to a conventional technique.
Figure 3B:
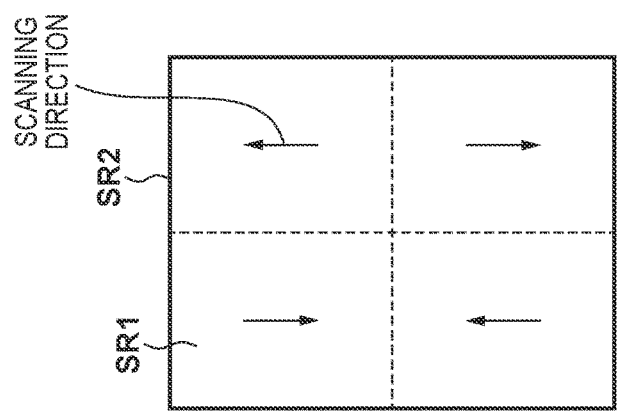
Figure 3C:
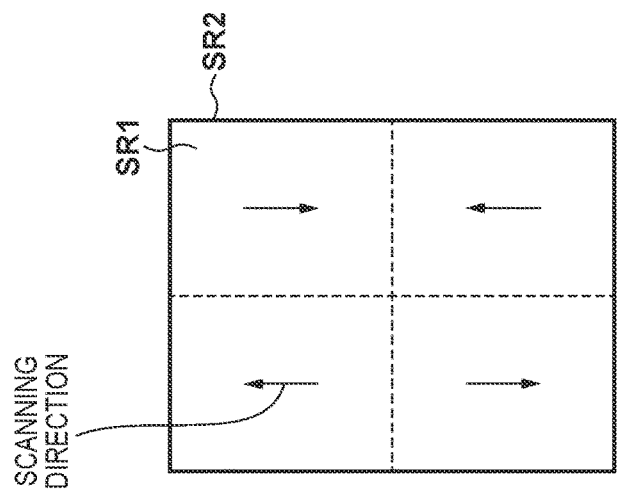

FIG. 3A is a view showing a state in which the first layer (FIG. 2A) and the second layer (FIG. 2B) are overlaid on each other without considering the first layout information representing the layout of the first shot regions SR1 and the second layout information representing the layout of the second shot regions SR2, that is, according to the conventional technique. In this case, it is understood that some of combinations each including the scanning directions and the four first shot regions SR1 included in each second shot region SR2 are different, as shown in FIGS. 3B and 3C.

Figure 4A:
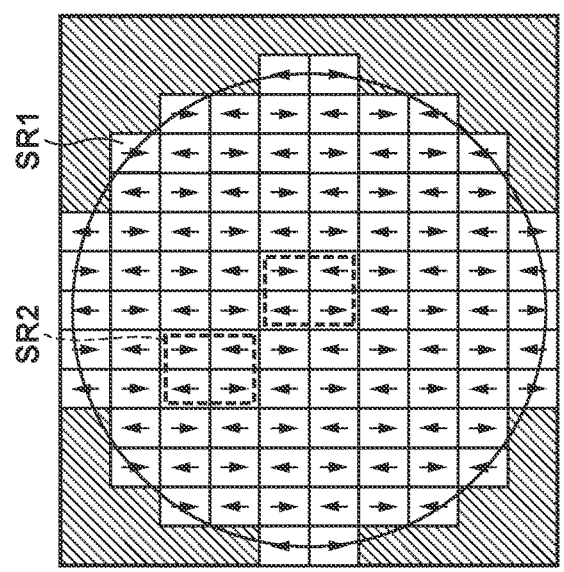
FIGS. 4A to 4C are views for explaining a case in which the first and second layers are overlaid on each other according to an embodiment.
Figure 4B:
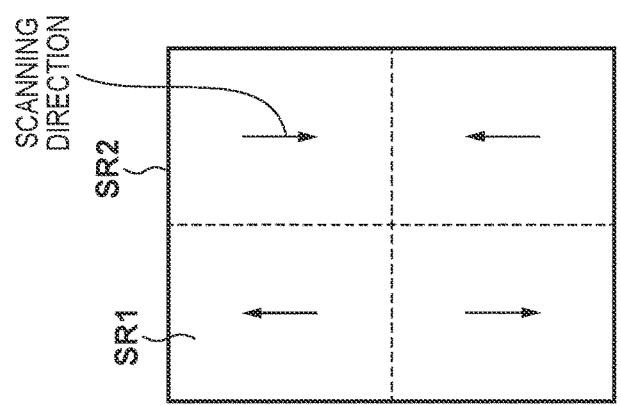
Figure 4C:
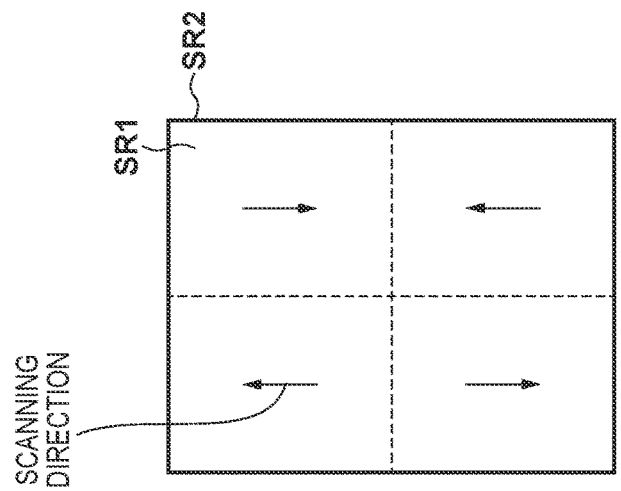

FIG. 4A is a view showing a state in which the first layer (FIG. 2A) and the second layer (FIG. 2B) are overlaid on each other according to this embodiment. In this embodiment, as described above, the scanning direction when performing scanning exposure for each of the first shot regions SR1 is determined based on the first layout information and the second layout information. Therefore, as shown in FIGS. 4B and 4C, combinations each including the scanning directions and the four first shot regions SR1 included in each second shot region SR2 are identical.

As described above, in this embodiment, overlay (first layout information and second layout information) between the first shot regions SR1 and the second shot regions SR2 is obtained in advance, and the scanning direction when performing scanning exposure for each of the first shot regions SR1 is determined. Consequently, the combinations each including the scanning directions and the first shot regions SR1 can be identical in all the second shot regions SR2.

EXAMPLE 2

Figure 5A:
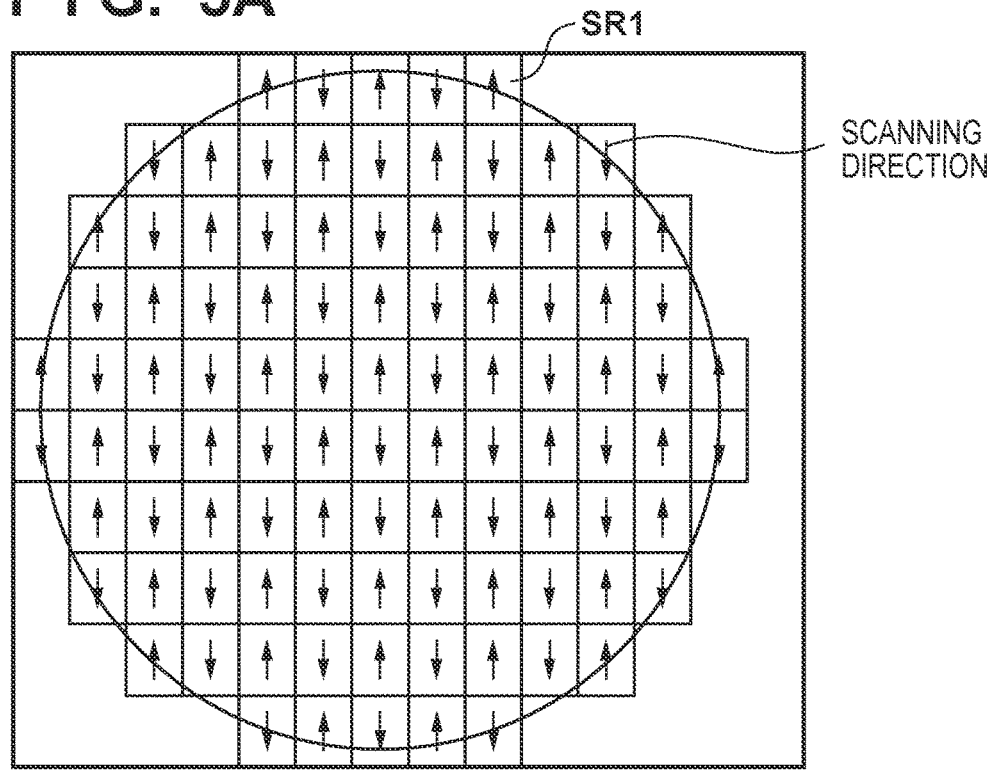
FIGS. 5A and 5B are views respectively showing an example of the layout of the first shot regions and an example of the layout of the second shot regions.
Figure 5B:
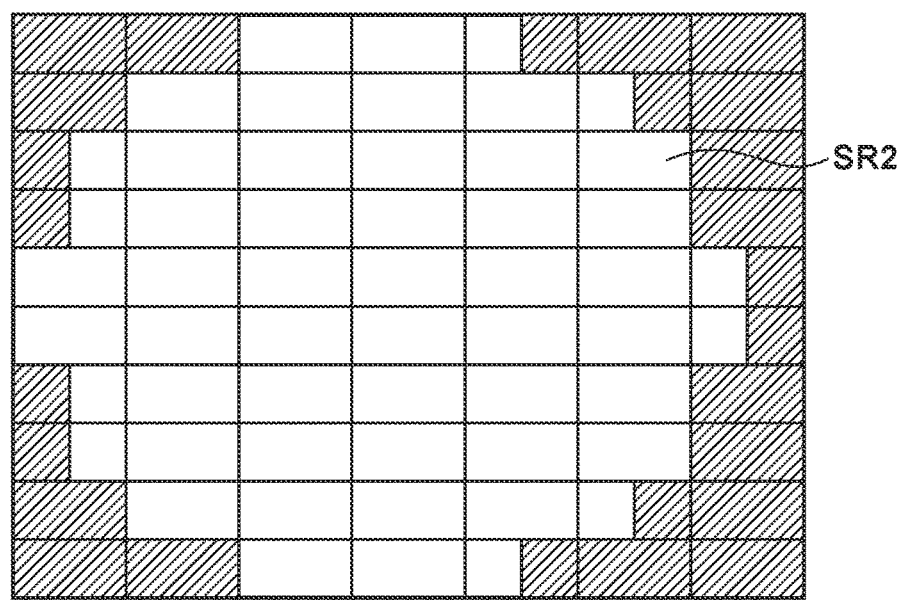

FIG. 5A is a view showing an example of the layout of a plurality of first shot regions SR1 in the first layer. In FIG. 5A, a scanning direction when performing scanning exposure for each of the first shot regions SR1 is indicated by an arrow. FIG. 5B is a view showing an example of the layout of a plurality of second shot regions SR2 in the second layer. Referring to FIGS. 5A and 5B, the size of the first shot region SR1 is different from that of the second shot region SR2, and the second shot region SR2 has a size corresponding to a size including two first shot regions SR1.

Figure 6A:
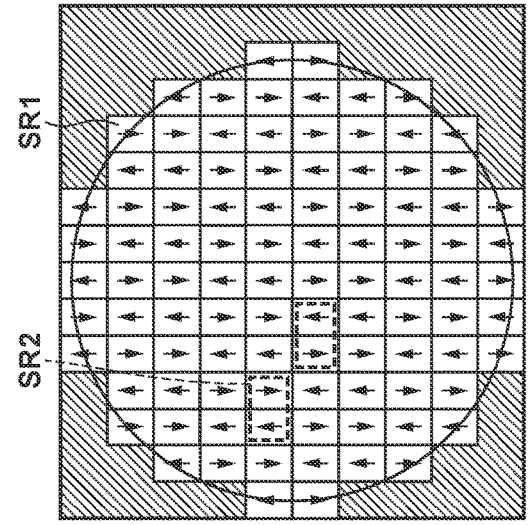
FIGS. 6A to 6D are views for explaining a case in which the first and second layers are overlaid on each other according to the conventional technique.
Figure 6B:
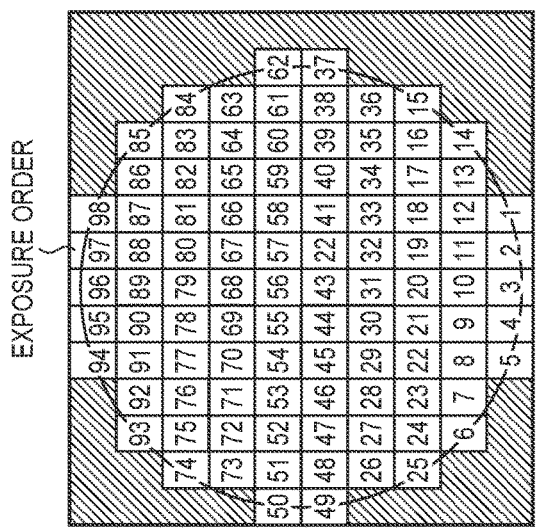
Figure 6C:
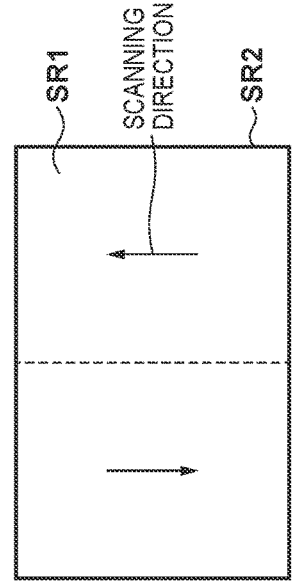
Figure 6D:
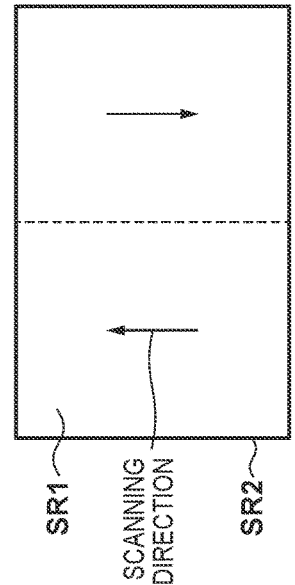

FIG. 6B is a view showing a state in which the first layer (FIG. 5A) and the second layer (FIG. 5B) are overlaid on each other when scanning exposure is performed for the first shot regions SR1 in an exposure order shown in FIG. 6A. When performing scanning exposure for each shot region of a substrate, an exposure order is generally set from a shot region at the end of the substrate to form a meandering shape, as shown in FIG. 6A. In this case, some of combinations each including the scanning directions and the two first shot regions SR1 included in each second shot region SR2 are different, as shown in FIGS. 6C and 6D.

Figure 7B:
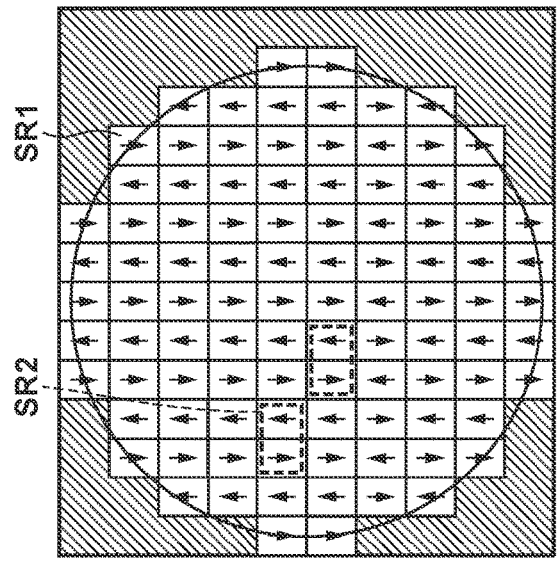
FIGS. 7A to 7D are views for explaining a case in which the first and second layers are overlaid on each other according to the embodiment.
Figure 7D:
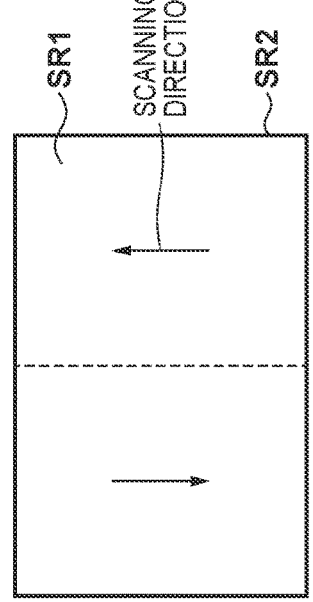
Figure 7A:
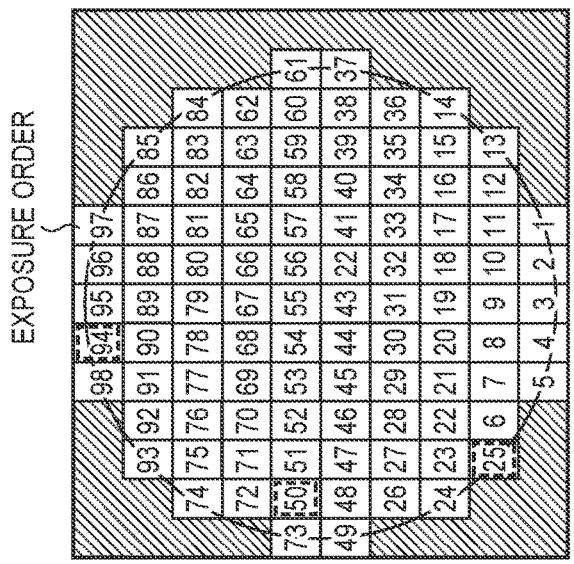
Figure 7C:
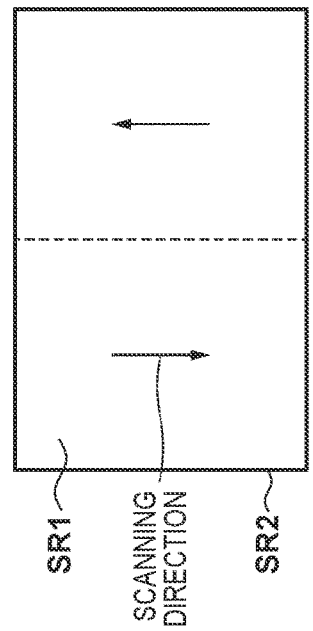

FIG. 7B is a view showing a state in which the first layer (FIG. 5A) and the second layer (FIG. 5B) are overlaid on each other when scanning exposure is performed for the first shot regions SR1 in an exposure order shown in FIG. 7A. In this embodiment, as described above, the scanning direction when performing scanning exposure for each of the first shot regions SR1 is determined based on the first layout information and the second layout information. Then, the exposure order in which the first shot regions SR1 undergo scanning exposure is changed so that the scanning direction when performing scanning exposure for each of the first shot regions SR1 is set to the determined scanning direction. More specifically, as shown in FIG. 7A, the exposure ordinal numbers of the first shot regions SR1 represented by dotted lines in FIG. 7A are changed from the exposure order shown in FIG. 6A. Thus, as shown in FIGS. 7C and 7D, combinations each including the scanning directions and the two first shot regions SR1 included in each second shot region SR2 are identical.

As described above, in this embodiment, overlay (first layout information and second layout information) between the first shot regions SR1 and the second shot regions SR2 is obtained in advance, and a scanning direction when performing scanning exposure for each of the first shot regions SR1 is determined. Then, the exposure order of the first shot regions SR1 is changed so that the scanning direction when performing scanning exposure for each of the first shot regions SR1 is set to the determined scanning direction. Consequently, the combinations each including the scanning directions and the first shot regions SR1 can be identical in all the second shot regions SR2.

EXAMPLE 3

When performing scanning exposure for a first shot region SR1 in the first processing, a correction table (RSP) for correcting an exposure error depending on the scanning direction of the shot region is selected in accordance with a scanning direction determined in this embodiment. In the first processing, scanning exposure is performed for the first shot region SR1 using the selected correction table.

Figure 8:
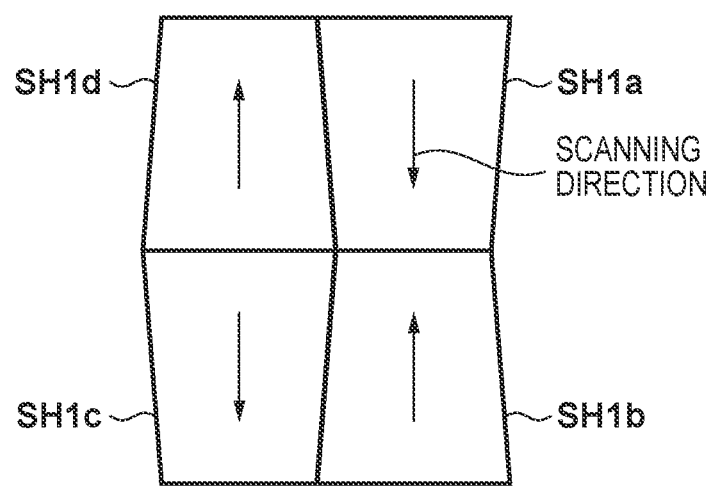
FIG. 8 is a view showing examples of exposure errors depending on the scanning directions of four first shot regions included in each second shot region.
Figure 9:
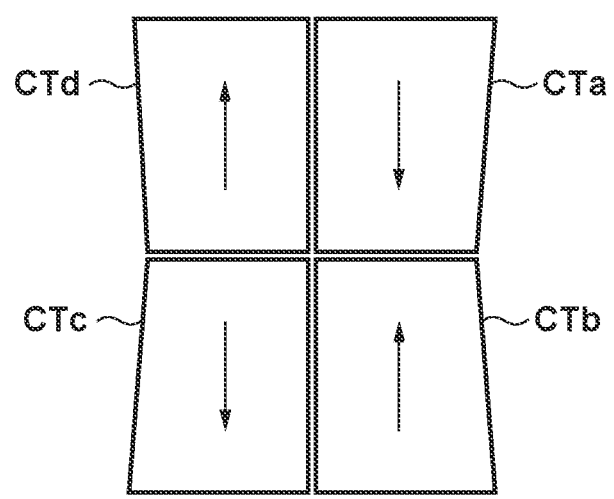
FIG. 9 is a view showing examples of correction tables for correcting the exposure errors shown in FIG. 8.

FIG. 8 is a view showing examples of exposure errors depending on the scanning directions of four first shot regions SR1a, SR1b, SR1c, and SR1d included in a second shot region SR2. In this case, when performing scanning exposure for the first shot region SR1a, a correction table CTa shown in FIG. 9 is selected, and scanning exposure is performed for the first shot region SR1a using the correction table CTa in the first processing. Furthermore, when performing scanning exposure for the first shot region SR1b, a correction table CTb shown in FIG. 9 is selected, and scanning exposure is performed the first shot region SR1b using the correction table CTb in the first processing. Similarly, when performing scanning exposure for each of the first shot regions SR1c and SR1d, a correction table CTc or CTd shown in FIG. 9 is selected, and scanning exposure is performed for each of the first shot regions SR1c and SR1d using the correction table CTc or CTd in the first processing.

As described above, with respect to each of the first shot regions SR1a to SR1d, it is possible to correct the exposure error depending on the scanning direction by changing the correction table to be used in the first processing among the correction tables CTa to CTd in accordance with the scanning direction determined in this embodiment.

EXAMPLE 4

Figure 10:
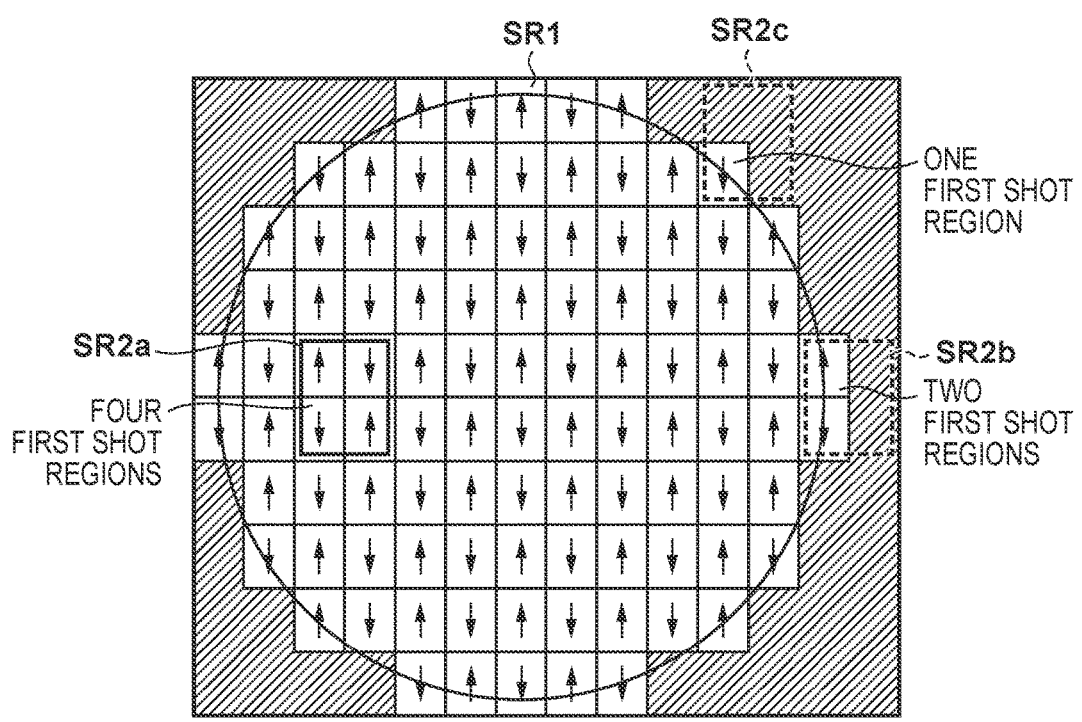
FIG. 10 is a view for explaining the number of first shot regions included in each second shot region.

In a shot layout, as shown in FIG. 10, the number of first shot regions SR1 included in each second shot region SR2 may be different depending on the position of the second shot region SR2. For example, a second shot region SR2$a$ in the central portion of a substrate includes four first shot regions SR1 but a second shot region SR2$b$ in the peripheral portion of the substrate includes only two first shot regions SR1. Furthermore, a second shot region SR2$c$ in the peripheral portion of the substrate includes only one first shot region SR1. Unlike a case in which an imprint process is performed for the second shot region SR2$a$ (complete shot region), when performing an imprint process for each of the second shot regions SR2$b$ and SR2$c$ (partial shot regions), a specific distortion is generated. To cope with such specific distortion, when performing scanning exposure for each of the first shot regions SR1, a correction table is selected in accordance with the number of first shot regions SR1 included in the second shot region SR2 in addition to a scanning direction determined in this embodiment. In other words, even if the scanning direction when performing scanning exposure for the first shot region SR1 is the same, a correction table to be used in the second processing is preferably changed in accordance with the number of first shot regions SR1 included in the second shot region SR2. This can more accurately correct an exposure error depending on the scanning direction when performing scanning exposure for the first shot region SR1.

EXAMPLE 5

Figure 11A:
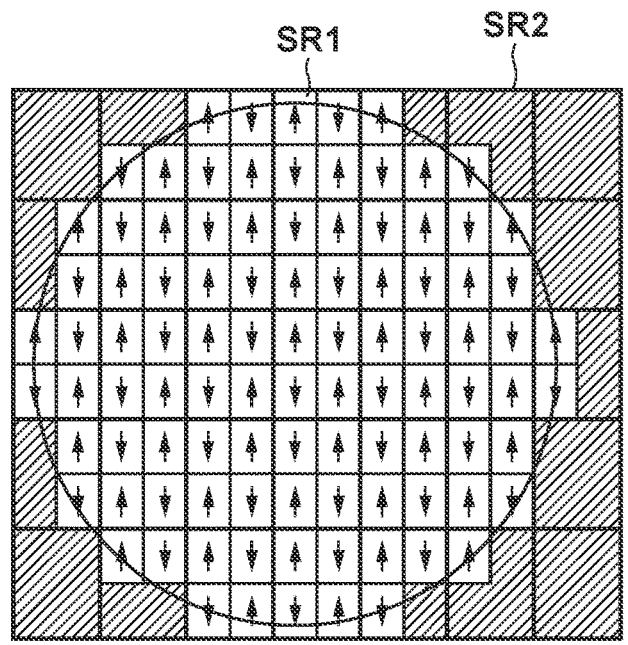
FIGS. 11A and 11B are views for explaining the number of first shot regions included in each second shot region.
Figure 11B:
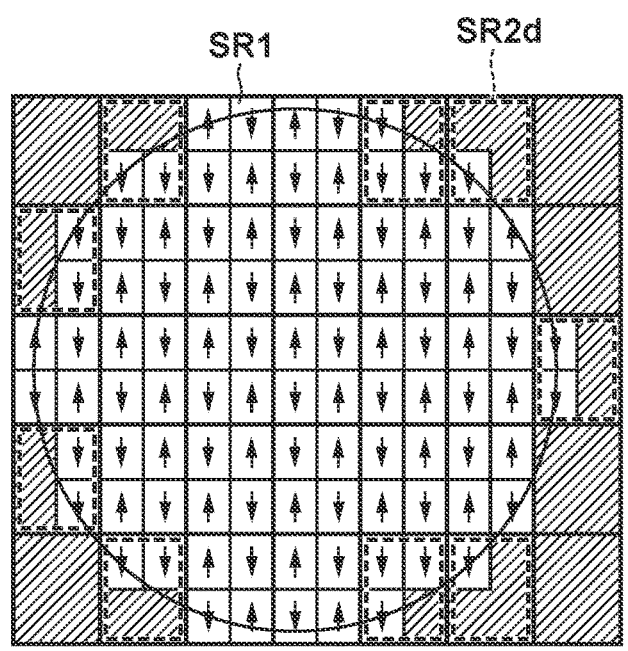

In a shot layout, as shown in FIGS. 11A and 11B, the number of first shot regions SR1 included in each second shot region SR2 may be different depending on the position of the second shot region SR2. For example, each second shot region SR2$d$ (partial shot region) in the peripheral portion of a substrate includes only one to three first shot regions SR1, as shown in FIG. 11B. As shown in FIG. 11A, scanning exposure is generally performed for the second shot region SR2$d$ by matching the scanning directions so as to obtain the same shot layout as that of the second shot region SR2$a$ (see FIG. 10). However, as for the second shot region SR2$d$, the scanning directions different from those of other shot regions can be set in consideration of the characteristics when performing an imprint process for the second shot region SR2 having the second size. For example, when pressing a mold against an imprint material in the second shot region SR2$d$, a method of applying a force or a method of curing the imprint material, which is different from that for other shot regions, may be adopted in consideration of protrusion of the imprint material. Therefore, as shown in FIG. 11B, in a specific shot region, that is, in the second shot region SR2$d$, scanning exposure may be performed by setting scanning directions different from those of other shot regions.

A method of manufacturing an article according to an embodiment of the present invention is suitable for manufacturing an article such as a semiconductor device or a liquid crystal display element. The manufacturing method includes a step of forming a pattern on a substrate using the above-described lithography method, and a step of processing the substrate on which the pattern has been formed. This manufacturing method can further include other well-known steps (for example, oxidization, deposition, vapor deposition, doping, planarization, etching, resist removal, dicing, bonding, and packaging) following the above forming step. The method of manufacturing the article according to the embodiment is superior to a conventional method in at least one of the performance, quality, productivity, and production cost of the article.

Furthermore, a determination method of determining a scanning direction when performing scanning exposure for each of the first shot regions at the time of forming, on the substrate, the first and second layers to be overlaid on each other and an information processing apparatus for executing the determination method also constitute one aspect of the present invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2016-109645 filed on Jun. 1, 2016, and 2017-091948 filed May 2, 2017 which are hereby incorporated by reference herein in their entirety.

What is claimed is:

1. A lithography method of forming, on a substrate, a first layer including a layout of a plurality of first shot regions each having a first size and a second layer including a layout of a plurality of second shot regions each having a second size corresponding to a size including at least two first shot regions to be overlaid on each other, by first processing of forming the first layer in a process including scanning exposure and second processing of forming the second layer, the method comprising:

obtaining first layout information representing the layout of the first shot regions, and second layout information representing the layout of the second shot regions; and determining, for each of the first shot regions, based on the first layout information and the second layout information, a scanning direction when performing scanning exposure for the first shot region in the first processing, wherein in the determining, the scanning direction is determined so that combinations of scanning directions of respective at least two first shot regions included in the second shot regions in the first processing are identical in all of the second shot regions, and wherein at least one of the scanning directions of the at least two first shot regions included in each of the second shot regions is different from another.

2. The method according to claim 1, further comprising:
changing, to the scanning direction determined in the determining, a scanning direction when performing scanning exposure for each of the first shot regions, which is included in a recipe for forming the first layer.

3. The method according to claim 1, further comprising:
changing an exposure order, in which the first shot regions undergo scanning exposure, included in a recipe for forming the first layer so that a scanning direction when performing scanning exposure for each of the first shot regions is set to the scanning direction determined in the determining.

4. The method according to claim 1, further comprising:
changing a moving path of the substrate between the first shot regions, which is included in a recipe for forming the first layer, so that a scanning direction when performing scanning exposure for each of the first shot regions is set to the scanning direction determined in the determining.

5. The method according to claim 1, further comprising:
selecting, for each of the first shot regions, in accordance with the scanning direction determined in the determining, a correction table for correcting an exposure error depending on the scanning direction when performing scanning exposure for the first shot region, wherein in the first processing, scanning exposure is performed for the first shot region using the correction table selected in the selecting.

6. The method according to claim 5, wherein in the selecting, the correction table is selected in accordance with the number of first shot regions included in the second shot region in addition to the scanning direction determined in the determining.

7. The method according to claim 1, wherein different lithography apparatuses are used in the first processing and the second processing.

8. The method according to claim 7, wherein in the second processing, an imprint apparatus for forming a pattern by bringing a mold into contact with an imprint material on the substrate forms the second layer.

9. A method of manufacturing an article, the method comprising:
forming a pattern on a substrate using a lithography method according to claim 1; and
processing the substrate on which the pattern has been formed.

10. A determination method of determining a scanning direction when performing scanning exposure for each of a plurality of first shot regions at the time of forming, on a substrate, a first layer including a layout of the plurality of first shot regions each having a first size and a second layer including a layout of a plurality of second shot regions each having a second size corresponding to a size including at least two first shot regions to be overlaid on each other, by first processing of forming the first layer in a process including scanning exposure and second processing of forming the second layer, the method comprising:

obtaining first layout information representing the layout of the first shot regions, and second layout information representing the layout of the second shot regions; and determining, for each of the first shot regions, based on the first layout information and the second layout information, a scanning direction when performing scanning exposure for the first shot region in the first processing, wherein in the determining, the scanning direction is determined so that combinations of scanning directions of respective at least two first shot regions included in the second shot regions in the first processing are identical in all of the second shot regions, and wherein at least one of the scanning directions of the at least two first shot regions included in each of the second shot regions is different from another.

11. An information processing apparatus comprising:
a processing unit configured to execute a determination method of determining a scanning direction when performing scanning exposure for each of a plurality of first shot regions at the time of forming, on a substrate, a first layer including a layout of the plurality of first shot regions each having a first size and a second layer including a layout of a plurality of second shot regions each having a second size corresponding to a size including at least two first shot regions to be overlaid on each other, by first processing of forming the first layer in a process including scanning exposure and second processing of forming the second layer, wherein the processing unit executes obtaining first layout information representing the layout of the first shot regions, and second layout information representing the layout of the second shot regions, and determining, for each of the first shot regions, based on the first layout information and the second layout information, a scanning direction when performing scanning exposure for the first shot region in the first processing, and in the determining, the scanning direction is determined so that combinations of scanning directions of respective at least two first shot regions included in the second shot regions in the first processing are identical in all of the second shot regions, and wherein at least one of the scanning directions of the at least two first shot regions included in each of the second shot regions is different from another.

12. A storage medium storing a program for causing an information processing apparatus to execute a determination method of determining a scanning direction when performing scanning exposure for each of a plurality of first shot regions at the time of forming, on a substrate, a first layer including a layout of the plurality of first shot regions each having a first size and a second layer including a layout of a plurality of second shot regions each having a second size corresponding to a size including at least two first shot regions to be overlaid on each other, by first processing of forming the first layer in a process including scanning exposure and second processing of forming the second layer, the program causing the information processing apparatus to execute:

obtaining first layout information representing the layout of the first shot regions, and second layout information representing the layout of the second shot regions; and determining, for each of the first shot regions, based on the first layout information and the second layout information, a scanning direction when performing scanning exposure for the first shot region in the first processing, wherein in the determining, the scanning direction is determined so that combinations of scanning directions of respective at least two first shot regions included in the second shot regions in the first processing are identical in all of the second shot regions, and wherein at least one of the scanning directions of the at least two first shot regions included in each of the second shot regions is different from another.

* * * * *